United States Patent
Lee (10) Patent No.: US 6,256,235 B1
(45) Date of Patent: Jul. 3, 2001

(54) ADJUSTABLE DRIVER PRE-EQUALIZATION FOR MEMORY SUBSYSTEMS

(75) Inventor: Terry R. Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/599,557

(22) Filed: Jun. 23, 2000

(51) Int. Cl.$^7$ .................................................. G11C 7/00
(52) U.S. Cl. ............................. 365/189.11; 365/189.05; 327/108; 327/112
(58) Field of Search .................. 365/189.11, 189.05; 327/108, 112, 270, 306, 317, 318, 437, 442, 538

(56) References Cited

U.S. PATENT DOCUMENTS

| | | | |
|---|---|---|---|
| 5,274,276 | * 12/1993 | Casper et al. ........................ 327/537 |
| 5,396,463 | * 3/1995 | Kim et al. ........................ 365/184.11 |
| 5,489,862 | * 2/1996 | Risinger et al. ..................... 327/108 |
| 5,773,999 | * 6/1998 | Park et al. ........................... 327/108 |
| 5,917,758 | * 6/1999 | Keeth ............................... 365/189.05 |
| 6,067,257 | * 5/2000 | Kitsukawa et al. ............. 365/189.11 |
| 6,069,504 | * 5/2000 | Keeth .................................... 327/108 |
| 6,141,263 | * 10/2000 | Protzman ........................ 365/189.11 |
| 6,177,819 | * 1/2001 | Nguyen ................................. 327/170 |

* cited by examiner

Primary Examiner—Tan T. Nguyen
(74) Attorney, Agent, or Firm—Dickstein Shapiro Morin & Oshinsky LLP (57) ABSTRACT

A method and apparatus are disclosed for programmably tailoring the waveform of a data signal applied to a data path of a data bus to compensate for signal distortions to the data signal as it travels over the data path.

113 Claims, 10 Drawing Sheets

PROGRAMMABLE SLEW RATE AND AMPLITUDE DRIVER CIRCUIT

OUTPUT PULSES WITH PRE-EMPHASIS

FIG. 4

WAVEFORM SEEN BY DIMM1 WITH
PRE-EMPHASIS OF THE CONTROLLER DRIVER

FIG. 5

FIG. 6 PROGRAMMABLE SLEW RATE AND AMPLITUDE DRIVER CIRCUIT

FIG. 7A
MAXIMUM SLEW RATE AND AMPLITUDE

FIG. 7B
REDUCED SLEW RATE WITH MAXIMUM AMPLITUDE

FIG. 7C RISE TIME SHAPING

FIG. 7D

AMPLITUDE AND RISE TIME SHAPING

ADJUSTABLE DRIVER PRE-EQUALIZATION FOR MEMORY SUBSYSTEMS

FIELD OF THE INVENTION

The present invention relates to compensating data signals applied to a memory bus and, more particularly, to tailoring the waveform of a data signal to compensate for signal degradation characteristics of a signal path.

DISCUSSION OF RELATED ART

Memory subsystems for computers and networking systems provide many memory devices on a common bus to allow larger storage and transmission capacities than can be obtained with a single memory device. The memory devices are multiplexed on to a single bus to reduce the pin count of a memory bus master or controller. Most of these systems require user upgradeable or replaceable components to allow future expansion or repair of the memory subsystems. Typically, these systems are upgraded on a module basis, where the memory module (e.g., a single or dual in-line memory module, SIMM or DIMM) has several memory devices on a small printed circuit board (PCB), and the module plugs into a connector that provides an electrical connection to the memory subsystem bus.

From a signal integrity standpoint, the provision of many memory devices on the bus can be problematic since these modules represent electrical stubs to the memory bus which cause reflections on the bus. These reflections degrade the signal integrity, and therefore, the maximum bandwidth or timing margin of the system. A very robust electrical design is required in these systems since the signal integrity must be acceptable for both lightly loaded systems, that is, only a small number of module slots are populated, as well as heavily loaded systems, and for every device on the bus. A spectral analysis of a system memory subsystem has shown that the frequency response varies significantly depending upon which memory device is being read or written.

One good example of a memory system that must carefully balance the design for different loading characteristics is a DDR SDRAM main memory system. In such a system, four memory slots can be provided with a bus data rate of 266 Mbps per pin. Balancing the design to be acceptable for lightly loaded and heavily loaded systems can be challenging due to the number of slots, and the large variance in combinations of loading. For example, a memory write to the first module closest to a controller with all four slots populated results in a large negative reflection on the bus, and a large undershoot of a data signal is seen at the memory devices of the first module. On the other hand, performing a write to this same location with only one module in the system results in a large overshoot of a data signal as seen at the memory devices. This demonstrates the challenge in balancing the design to work under both of these loading conditions, and at a fast data rate.

SUMMARY OF THE INVENTION

The present invention seeks to provide a more uniform frequency response for a device driver and a bus. Programmable pre-emphasis is applied to a bus driver output signal when a data signal is generated on the bus. The pre-emphasis can be tailored to the device receiving the data and the characteristics of the path between them such that a relatively clean square shaped pulse is seen at the data receiving device.

Pre-emphasis is achieved by changing the bus driver output signal waveform. In the case of a memory subsystem, the waveform can be tailored in accordance with signal degradation characteristics of the bus and memory device. As one example of use of the invention, the drive output waveform may be modified depending on the location of a memory device on the bus which will be receiving the data to compensate for signal degradation along the data path.

BRIEF DESCRIPTION OF THE DRAWINGS

These and other advantages and features of the invention will be more clearly understood from the following detailed description which is provided in connection with the accompanying drawings in which.

DETAILED DESCRIPTION OF THE PREFERRED EMBODIMENTS

A memory subsystem, consisting of a multiplicity of memory devices or modules, is connected to a processing device, such as a CPU, or to a bus controller, such as a memory controller. A shared bus is used to connect the devices. The physical and electrical attributes of the bus, as seen by the device driver, depend upon the physical location of any termination resistance, the presence of other devices on the bus, the location to either end of the bus, the length of stubs connecting the device to the main bus, or the location of parasitic capacitance on the bus. Therefore, the frequency response of the network that each device must drive may differ depending upon where the device is located on the bus, even if the devices are otherwise identical. As a result of the different frequency response characteristics, the signal integrity of the signal at the receiving device will differ depending upon which device drives the bus and its spatial location relative to the receiving device. In prior memory subsystems, some tradeoffs are made in the driver characteristics of a driving device that may compromise the signal quality for some receiving device locations while improving the quality for other device receiving locations. The degraded signal quality that occurs when certain devices drive the bus will reduce the maximum operating frequency of the bus, since timing uncertainty will result from the non-flat frequency response.

In order to reduce timing uncertainty on the bus, and to maximize the operating frequency of the bus, the invention provides a relatively constant frequency response for the network consisting of the device driver and the bus. Pre-emphasis is used to waveform shape a driving signal data pulse. With pre-emphasis, the pulse delivered into the bus is shaped such that a relatively clean and square shaped pulse is received at a receiver.

The invention uses pre-emphasis in a multi-device memory subsystem. Since the memory devices may be identical throughout the subsystem but reside at different locations on the memory subsystem, a programmable means for changing the output waveform of a driving device is necessary. In the case of the bus masters, such as a CPU or controller, it may be desirable for the driver output waveform to be modified depending upon which device on the bus will be receiving the data. For example, a device at the far end of the bus may have higher frequencies attenuated due to losses in the transmission line. In this case, a wave shape should be transmitted that has larger amplitudes of high frequency components than the case of when a near device would be receiving the data. This simple case can be accommodated by driving the bus with a faster rise/fall time when sending a data pulse to a far device.

Figure 1:
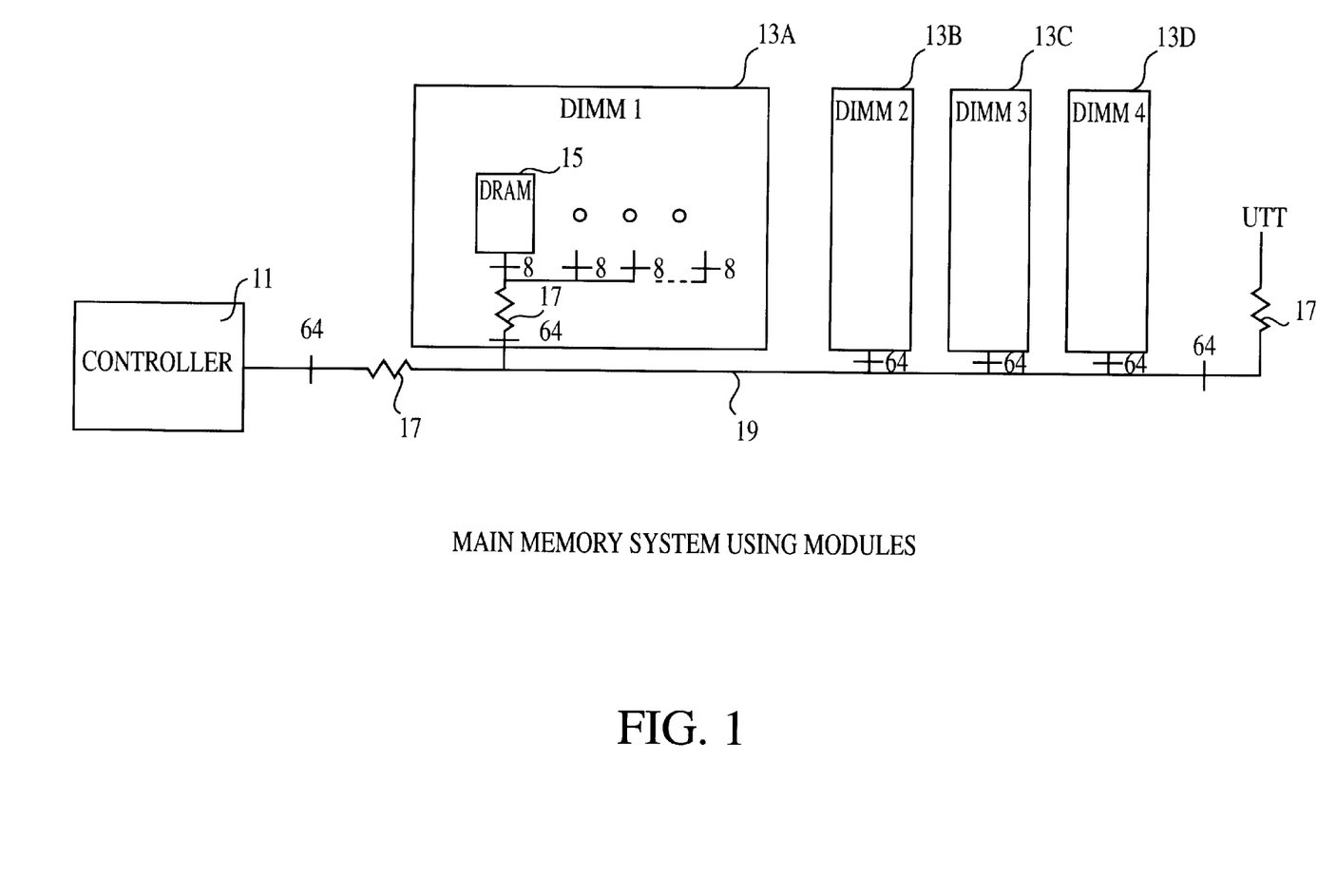
FIG. 1 illustrates a memory system with which the invention may be used.

The invention will now be described with reference to exemplary embodiments. FIG. 1 shows an example of a memory subsystem which has a memory controller 11, and four memory modules of DIMMs 13a, 13b, 13c, 13d coupled over a data bus 19. In this example, each DIMM contains 8 memory devices 15 that are each 8 data bits wide. The data bus 19 width is 64 bits. This example is typical of a main memory system in a PC using double data rate (DDR) SDRAMs. Various resistors 17 would normally be included on the module and in the bus for termination of the bus transmission line or isolation of the transmission line stubs from the main memory bus on the motherboard. These techniques are well known in the art, and they are typical for this type of system.

Figure 2:
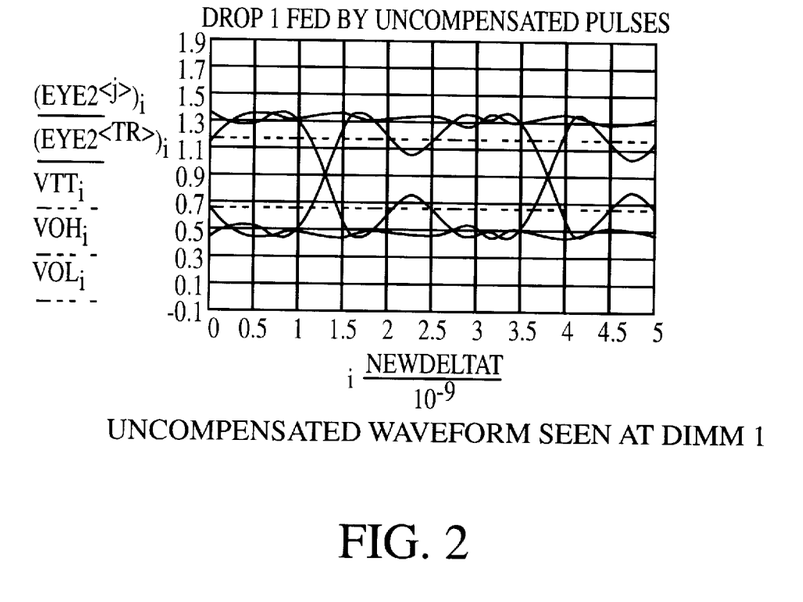
FIG. 2 represents an uncompensated data waveform seen at one of the memory modules of FIG. 1.
Figure 3:
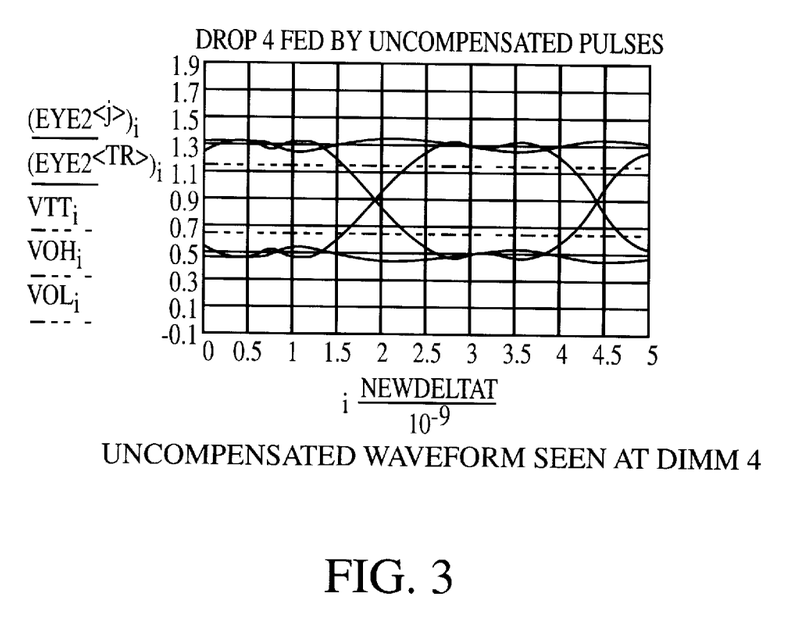
FIG. 3 represents an uncompensated data waveform seen at another of the memory modules of FIG. 1.

In the case of a Write operation, the memory controller 11 drives a data pulse to a DRAM device 15 intended to receive the data. FIG. 2 represents the waveform as seen by a DRAM device located on the nearest DIMM 13a to the controller 11, while FIG. 3 represents the waveform as seen by a DRAM device located on the last DIMM 13d. In both cases, the data output pulses applied to the bus 19 by the controller 11 are identical. In FIGS. 2 and 3, a pseudo random pulse train was used to allow the worst case data eyes to be plotted. The graphs in FIGS. 2 and 3 represent the composite response seen for a random data pattern. This random data pattern has more frequency content than a simple repeating "1" "0" data pattern.

Figure 4:
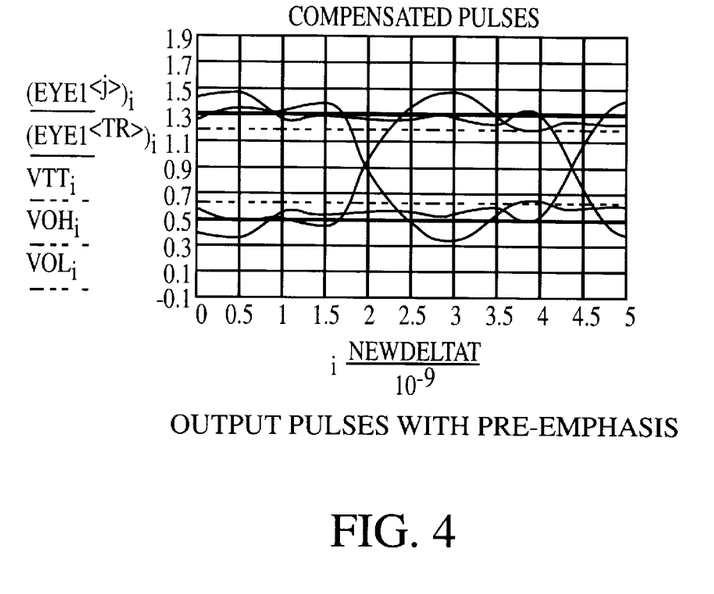
FIG. 4 represents a pre-emphasized data signal waveform produced in accordance with the invention.

Note that the pulse shape seen by the far DIMM 13d has reasonable signal integrity in this example, but the pulse shape at the first DIMM has considerable distortion. This is due to transmission line reflections that occur as a result of the bus topology. This distortion may cause bits to be incorrectly captured, and result in data transfer errors. FIG. 4 shows the data eye of a pseudo random pulse stream that has been pre-emphasized to compensate for the distortion seen by the nearest DIMM 13a. As shown, the compensation scheme primarily involves driving the data pulse to larger voltage levels at the beginning of the signal transition, and then reducing the output driver strength after some delay. This pulse shaping creates a deliberate signal overshoot as seen in the FIG. 4 diagram.

Figure 5:
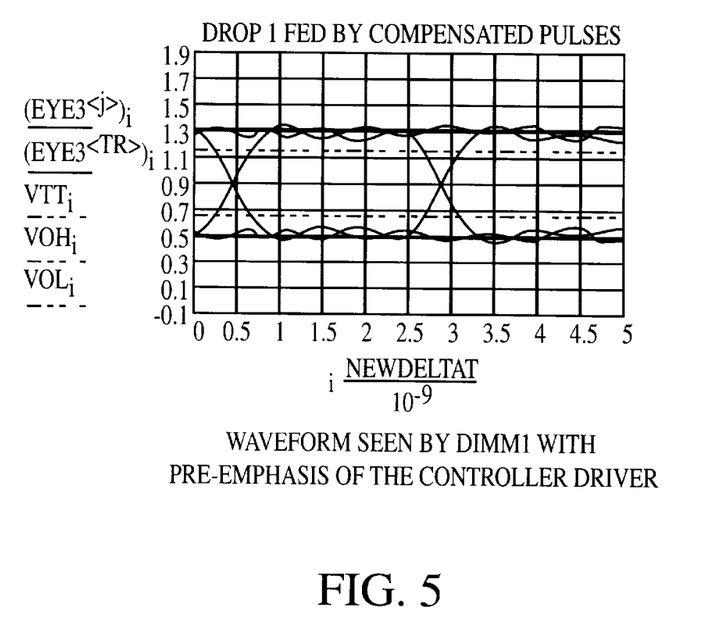
FIG. 5 represents a waveform seen at a receiving memory module of FIG. 1 when a pre-emphasized data signal is used.

FIG. 5 shows the data eye received at the first DIMM 13a using the pre-emphasis pulse stream in FIG. 4. As shown, there is a substantial improvement in signal integrity seen by the nearest DIMM 13a due to the pre-emphasis. Controller 11 has the ability to change the pre-emphasis scheme, or eliminate pre-emphasis as needed, depending upon which device 15 of which module 13a . . . 13d it is driving data to. This can be accomplished by providing programmability for the output driver enabling the specific waveform of the output data pulse to be programmable.

It may also be desirable for the DRAMs 15 to have different drive characteristics depending upon what location its associated module is located at so that data as seen at the controller 11 is consistent from all memory devices 15. One method for providing different DRAM driver output characteristics would include the controller programming a register on the DIMM 13a . . . 13d or in the individual DRAMs 15 to select the waveform pre-emphasis desired for that DIMM or DRAM. The pre-emphasis could be as simple as selecting a fast or slow output driver slew rate or may be more complicated. The controller would most likely program the modules differently based upon location. The DRAMs 15 would adjust their output drivers and pre-driver stages based upon the register programming. Other methods of programming, such as an analog voltage level into the chip, or a variable resistance between a voltage reference and an input pin of the DRAM, could also be used.

Figure 6:
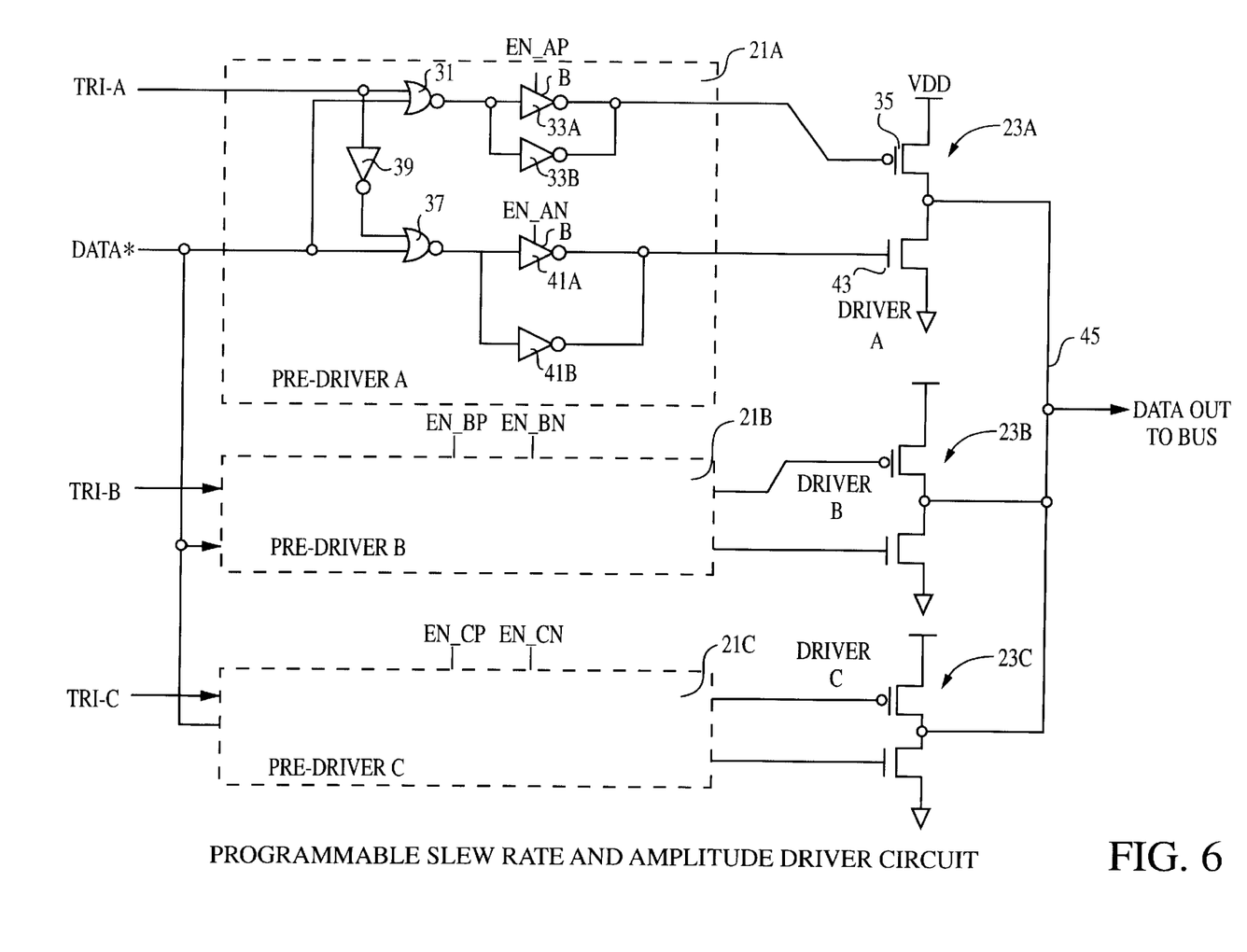
FIG. 6 illustrates an exemplary pre-emphasis circuit constructed in accordance with the invention.

FIG. 6 shows one embodiment of an output driver that has provisions for programmable pre-emphasis. This output driver may be used in the controller 11 for driving data on bus 19, or in individual DRAMs 15 for driving data on bus 19. It is also possible to place the FIG. 6 driver at the data path outputs of a memory module 13a . . . 13d.

The FIG. 6 output driver has three parallel stages of pre-drivers 21a, 21b, 21c, the outputs of which respectively control the drivers 23a, 23b, 23c. In this example, each pre-driver 21a, 21b, 21c has its own tri-state control signal, denoted as TRI_A, TRI_B and TRI_C.

Each pre-driver circuit is constructed in the same manner and therefore a description of only pre-driver circuit 21a is provided. Pre-driver circuit 21a contains a NOR gate 31 having one input for receiving a respective TRI_A signal and another input for receiving a DATA signal. The output of NOR gate 31 is applied to a pair of parallel connected inverting amplifiers 33a, 33b, one of which, 33a, receives an enabling control signal EN_AP. The common output of the inverting amplifiers 33a, 33b is applied to the control gate of a pull-up transistor 35 of a driver circuit 23a. Pre-driver circuit 21a also includes a NAND gate 37 which has one input connected to an output of an inverter 39 which receives the TRI_A signal, and another input which receives the DATA signal. The output of NAND gate 37 is applied to a pair of parallel connected inverting amplifiers 41a, 41b, one of which, 41a, receives an enabling control signal EN_AN. The common output of the inverting amplifiers 41a, 41b is applied to the control gate of a pull-down transistor 43 of driver circuit 23a. The pre-driver circuit 21a responds to the incoming DATA signal in accordance with the signals received on the control lines TRI_A, EN_AP and EN_AN to provide gate control signals to transistors 35 and 43 which produce an output data signal on output data path 45.

The manner of operation of pre-driver circuit 21a will now be described, it being understood that each of the pre-driver circuits 21b and 21c operate the same, but under control of their own respective control signals TRI_x, EN_xP and EN_xN.

When TRI_A is asserted, the gate to the p-channel transistor 35 is forced high, and the gate to the n-channel transistor 43 is forced low, so both pull-up and pull-down transistors 35, 43 are off. This results in a high impedance state at the output of driver 23a. When TRI_A is low, the pre-driver is enabled, and the DATA signal affects the output, DATA OUT. The pre-driver circuit 21a also receives driver adjustment signals, EN_AP and EN_AN. When the EN_AP signal is asserted, the redundant logic inverter 33a is turned on, so there is larger effective device widths driving the gate of the pull-up transistor 25. Likewise, when the EN_AN signal is asserted, there is a larger effective device width driving the gate of pull-down 43 transistor. Therefore, the rise and fall time at the driver 23a can be controlled by the signals EN_AP and EN_AN. This will vary the output voltage slew rate, independent of output voltage amplitude. The pull-up 35 and pull-down 43 transistors are shown as having separate enable control signals (EN_AP, EN_AN); however, these signals could be combined for a simpler logic circuit.

Amplitude adjustment of the DATA OUT signal on data path 45 is obtained by enabling the TRI signals for the various pre-drivers 21a, 21b, 21c. In this example, if all TRI_A, TRI_B and TRI_C signals are asserted, then all drivers 23a, 23b, 23c would be activated, and a larger effective device width would drive the output data path 45. In a parallel terminated system, this would effect the output amplitude of the DATA OUT signal on data path 45. Output slew rate can be adjusted by the number of EN_P,N signals that are asserted for the various pre-drivers 21a, 21b, 21c, and it may also be effected by the number of pre-driver circuits that are activated at the same time, via the TRI_x signals. In this regard, although FIG. 6 shows three pre-driver circuits 21a, 21b, 21c and their associated drivers 23a, 23b, 23c, any number of pre-drivers 21x and associated drivers 23x may be employed. The TRI_x signals can be asserted and de-asserted sequentially to effect the output slew rate, rise time, and pulse shape of the output signal. The time alignment of the TRI_x signals can be altered by providing different delays and pulse widths on the assertion/de-assertion of these signals. This relative delay of the TRI_x signals can be set to produce a predetermined waveform of the DATA OUT signal.

FIG. 7 illustrates with a few simple examples how DATA OUT signal waveforms can be implemented with the circuit topology of FIG. 6. It should be noted that many other DATA OUT waveforms can also be produced using the FIG. 6 circuit. Also, many other implementations for adjusting slew rate, the shape of rising and falling edges and amplitude of the DATA OUT signal can also be used to produce a desired form of the DATA OUT signal.

Figure 7A:
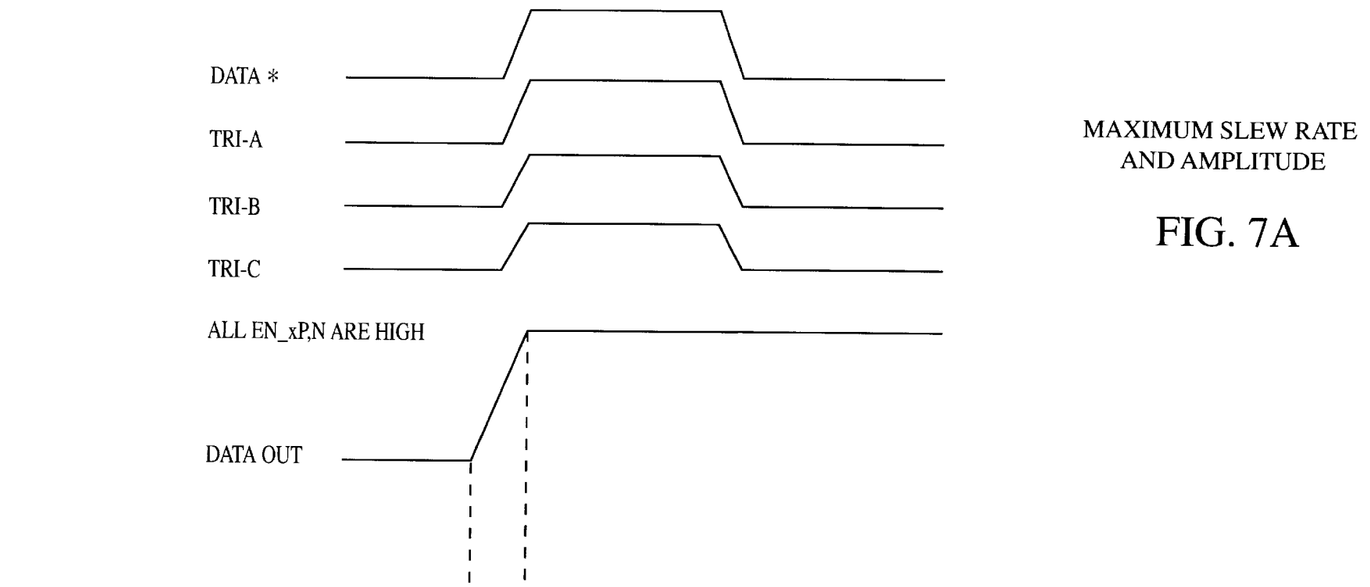
FIG. 7A, 7B, 7C and 7D represent examples of different data signal waveforms which can be produced by the FIG. 6 circuit.
Figure 7B:
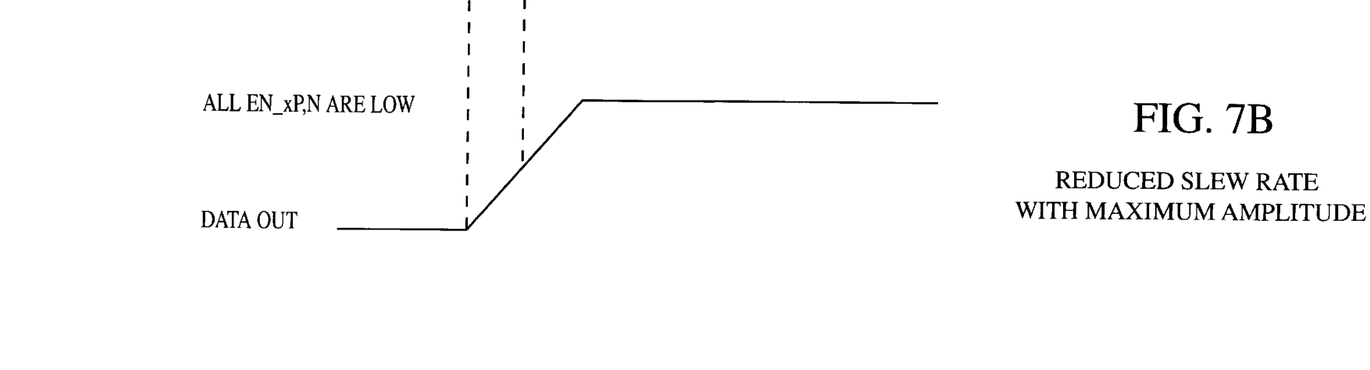
Figure 7C:
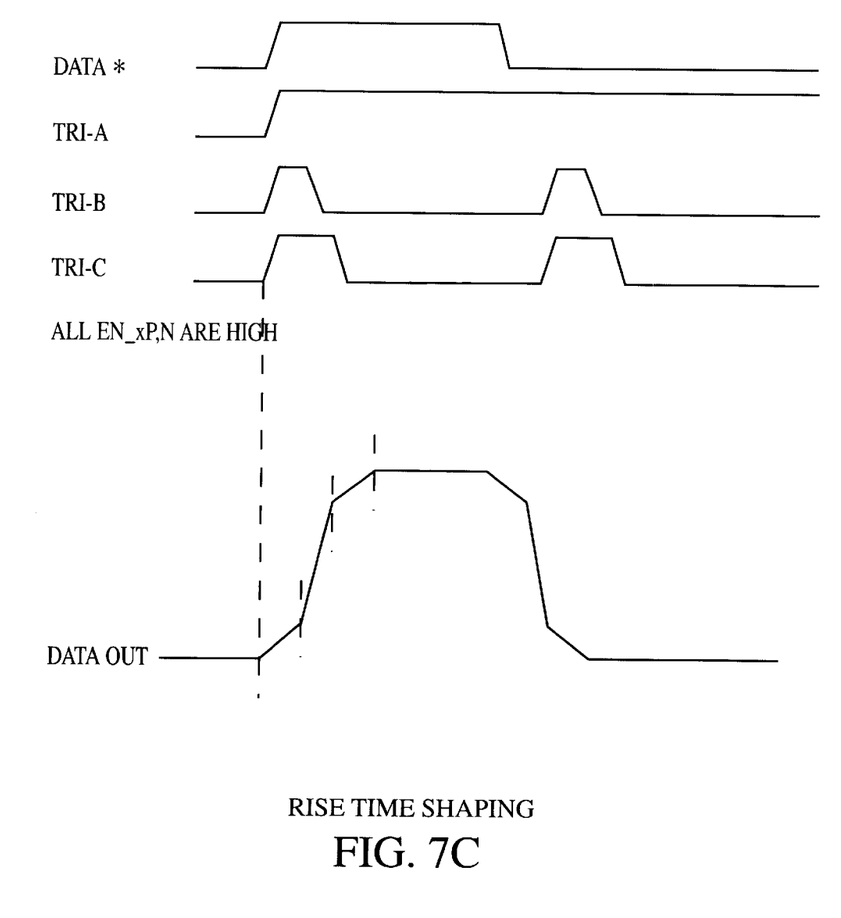
Figure 7D:
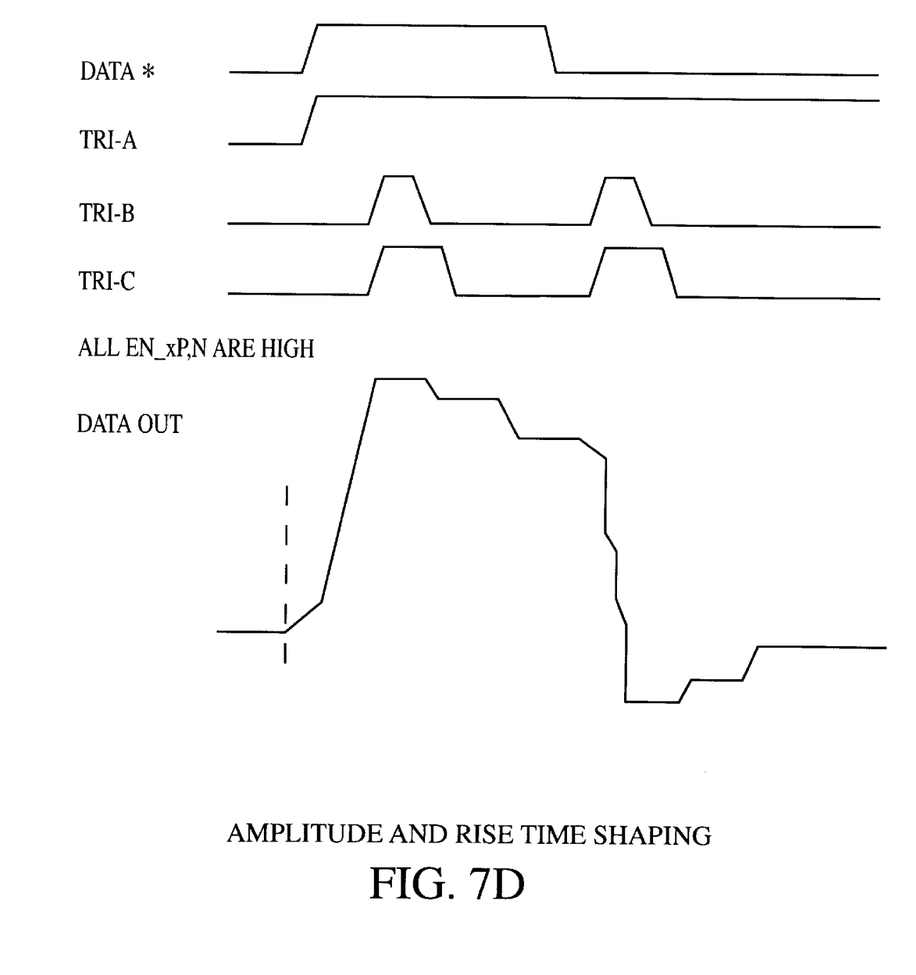

Using FIG. 6 as an exemplary embodiment, if all three TRI_A, TRI_B and TRI_C signals are driven nearly simultaneously with the DATA* signal, and if all of the EN_AP, EN_AN, EN_BP, EN_BN, EN_CP, EN_CN signals are previously activated, a pulse amplitude will be formed with maximum slew rate and amplitude, as shown in FIG. 7A. Slew rate can be reduced by turning off some of the EN_xP,N signals, as shown in FIG. 7B. The shape of the rising and falling edges of the DATA OUT signal can be altered by the relative timing of the TRI_x signals as shown in FIGS. 7C and 7D. FIG. 7D shows a particularly complex waveform which can be generated using the FIG. 6 circuit. The resulting waveshape of FIG. 7D approximates that of FIG. 4, when combined with the natural filtering effects of a heavily loaded system of FIG. 1. More precise control of slew rate is also possible by the relative time alignment of the EN_xP,N signals. FIGS. 7A . . . 7D all assume the EnxPn signals are high.

Figure 8:
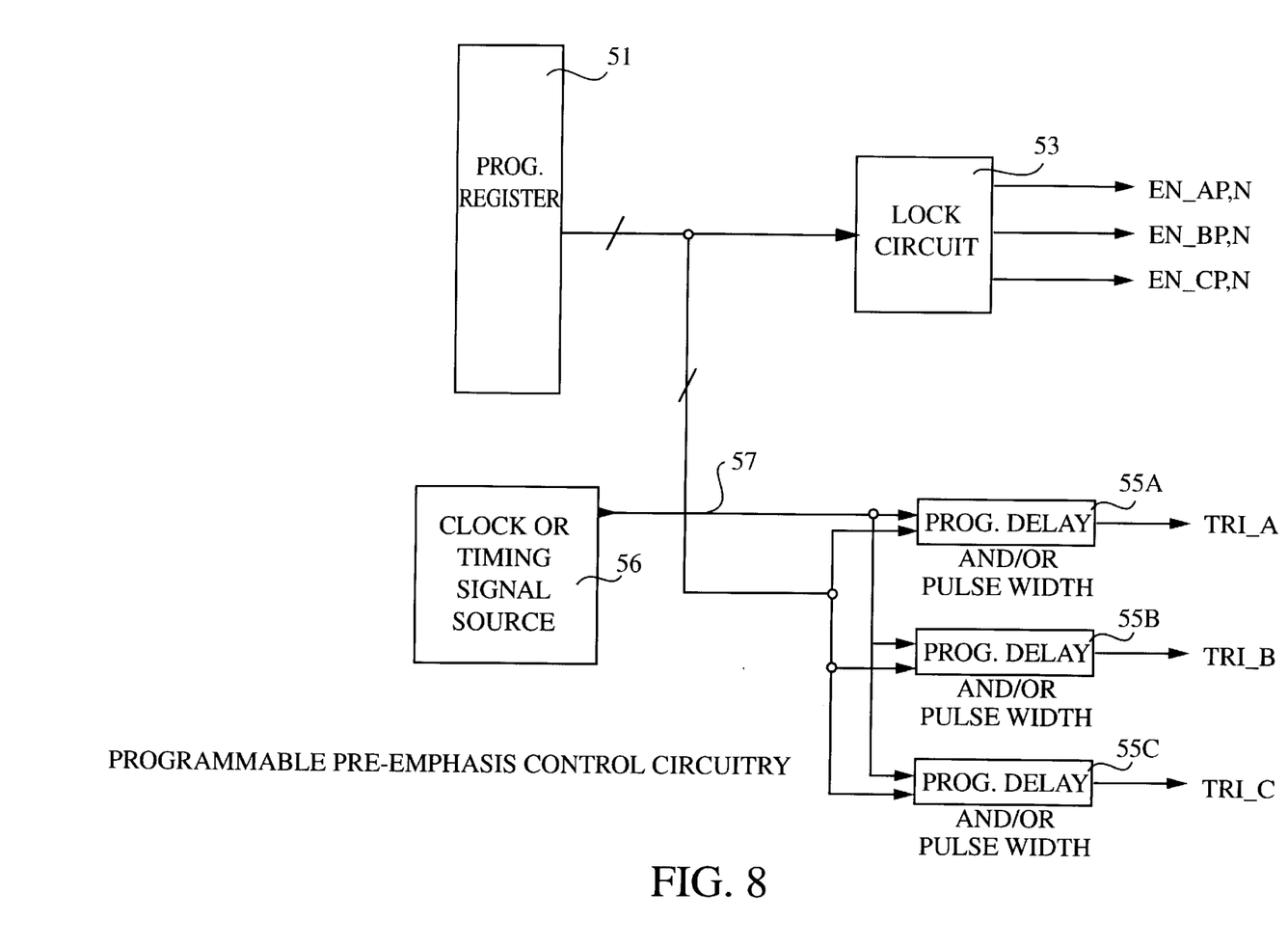
FIG. 8 illustrates an exemplary programming circuit for the FIG. 6 pre-emphasis circuit.

Programmability of a particular DATA OUT waveform can be simply accomplished by using programming bits, or register outputs, to select variable delay elements and otherwise generate the various control signals TRI_x and EN_xR,N, as shown in FIG. 8. FIG. 8 has a program register 51 which is loaded with programming bits from a storage location or a control device, e.g., a memory controller. The programming bits are applied to a first signal generator 53 which generates, depending on the content of the programming bits, the EN_AP, EN_AN, EN_BP, EN_BN, EN_CP and ENCN signals. Signal generator 53 may be a look-up device which generates an appropriate signal or signals depending on the applied programming bits. The programming bits applied to signal generator 53 can also select a pulse width and/or delay of each of the generator signals.

Programming bits from program register 51 are also applied to respective programmable delay and/or pulse width circuits 55a, 55b and 55c, each of which receives a clock or timing signal from source 56 on line 57 and which provides a respective output signal TRI_A, TRI_B, or TRI_C which have a programmable delay and/or pulse width. The amount of the delay and/or pulse width is determined by the programming bits loaded therein from register 51.

The programming circuit illustrated in FIG. 8 may be provided at the memory controller 11 and/or memory devices 15 or even at modules 13a, 13b, 13c, 13d for all of the memory devices 15 of a module. In all cases, the program register 51 is loaded with programming bits by a memory controller 11. In FIG. 8, the control bits will be used by the logic circuit to activate the EN_xP,N signals, and/or control their pulse width and/or delay and also to determine the relative pulse width and/or delays of the TRI_x signals.

Although the invention has been described with reference to use of a memory controller 11 supplying data signals to bus 14 in FIG. 1, it should be apparent that the memory controller may be a bus master or any type of device which provides data signals to a bus. The controller may be in the form of a programmed device such as a programmed controller, a DSP or CPU. It should also be apparent that FIGS. 6 and 8 illustrate exemplary circuits which can be used to provide a programmable DATA OUT signal waveform and that many modifications and substitutions can be made to these circuits without departing from the spirit o scope of the invention. The important aspect of the invention is that a programmable circuit be provided to allow for adjustment of any one or more of slew rate, rising and/or falling edge shaping, and amplitude of a data signal applied to a bus.

In addition, as noted above, the driving circuitry exemplified in FIG. 6 and programming circuitry exemplified in FIG. 8 can be provided in any device which needs to provide signals to different devices and/or different locations on a data bus. Accordingly, the FIGS. 6 and 8 exemplary circuits may be provided at a memory controller or other bus control device, at memory devices which are commanded to provide data to a bus, or at any other device which needs to provide data to a bus. The programming circuitry of FIG. 8 may also be provided on a memory module, e.g., 13a, 13b, 13c, 13d and supply suitable program signals to each of the memory devices 15 located on a module. Alternatively, only the program register 51 need be provided on a module, with the remainder of the circuitry for generating the program signals, being provided at each of the memory devices 15 of a module.

Although the programming circuit of FIG. 8 has been shown as a digital programming circuit, it is also possible to employ analog programming techniques as well in which different conditions can be programmed by different analog voltage levels on one or more analog programmable inputs. Also, instead of having separate pre-driver circuits 21a, 21b, 21c, it is also possible to construct the output devices 23a, 23b, 23c with one or more additional pull-up or pull-down transistors which can be controlled to affect the slew rate, and/or using rising/falling edge shape and/or amplitude of a DATA OUT signal generated by the output devices 23a, 23b, 23c on data path 45.

In addition, although the invention has been described with reference to an output buffer having three output drivers 23a, 23b, 23c, each of which has complementary P and N channel pull up and pull down transistors 35 and 43, the drive strengths of which are respectively controlled by a single gate, the invention can also be implemented with one output driver having complementary pull up and pull down transistors with each of the transistors having multiple gate fingers which are selectively enabled to control driver strength. The output of the devices is taken at the connection node of the complementary transistors.

With such an arrangement, each of the control signals applied to respective P channel transistors in FIG. 6 would go to respective gate fingers of a single P channel transistor, while each of the control signals for the respective N channel transistors in FIG. 6 would go to respective gate fingers of the N channel transistor.

Figure 10:
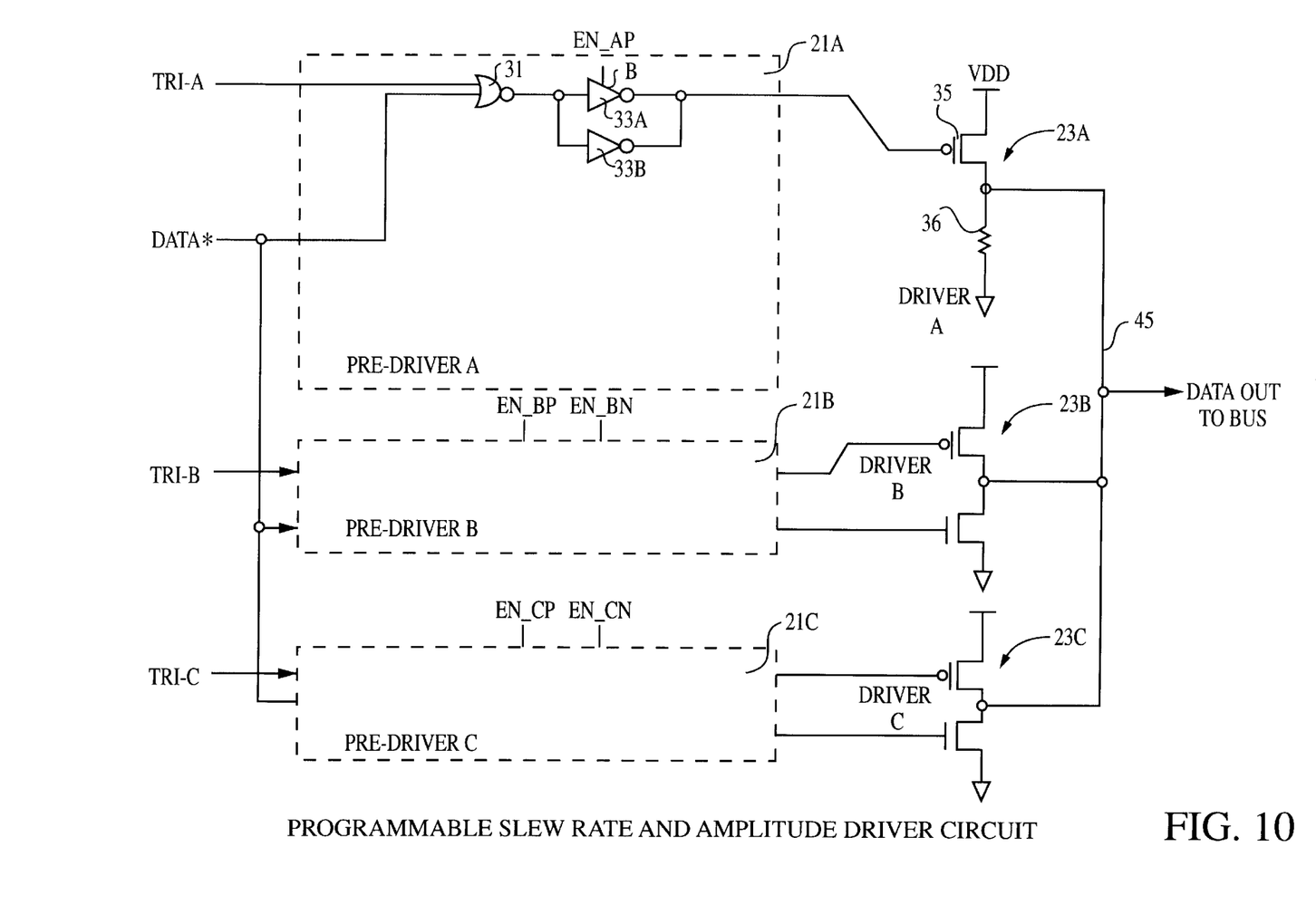
FIG. 10 illustrates an exemplary pre-emphasis circuit constructed in accordance with an alternate embodiment of the invention.

In addition, while each output driver 23a, 23b, 23c is shown as containing complementary P and N channel transistors 35 and 43 as pull-up and pull-down elements, it is also possible to replace one of the pull-up and pull-down transistors with a resistive element so that only one of a pull-up or pull-down transistor is used in the driver 23a, 23b, 23c. In this case, the pre-driver circuit 21a, 21b, 21c shown in FIG. 6 supplies only the P channel or N channel control signal, respectively, depending on which is replaced by a resistive element. For example, if the N-channel transistor 43 is replaced by a resistive pull-down element 36, then pre-driver circuit 21a supplies only the P-channel transistor 35 and the remaining circuitry and associated signal paths of pre-driver circuit 21a may be removed, including the inverting amplifiers 41a, 41b, the NAND gate 37, and the inverter 39, as shown in FIG. 10.

While the invention has particular utility in compensating for transmission path characteristics between a memory controller 11 and respective memory modules 13a, 13b, 13c, 13d, in which each of the memory modules may have its own unique waveform for the data signal and in which the memory controller 11 may program different waveforms depending on which module 13a, 13b, 13c, 13d it is sending data to, it is also possible to use the same waveform for data to and/or from two or more modules on a bus.

The system may also be programmed at the controller 11 and/or memory devices 15 such that the same DATA OUT waveform is used for data to and/or from all modules of a bus system, but the waveform is changed depending on the number of modules which are coupled to the bus. In this case, the memory controller 11 may interrogate the modules in populated slots of a bus system to see which slots are populated and then set an appropriate waveform for itself and/or the memory devices of the populated slots.

The programmable pulse width and/or delays 55a, 55b and 55c of FIG. 8 may also be used to compensate for data path delays between a memory controller 11 and a module 13a, 13b, 13c, 13d. For this to occur, the memory controller 11 sends a data signal to the bus and has it loop back to the controller. The arrival time of the loop back signal represents the transmission path delay which can be used by the memory controller to program the timing of the EN_xP, EN_xN, and TRI_x signals at the controller and/or memory devices to account for the signal path delay, in addition to providing for a desired waveform of the data output signal.

Figure 9:
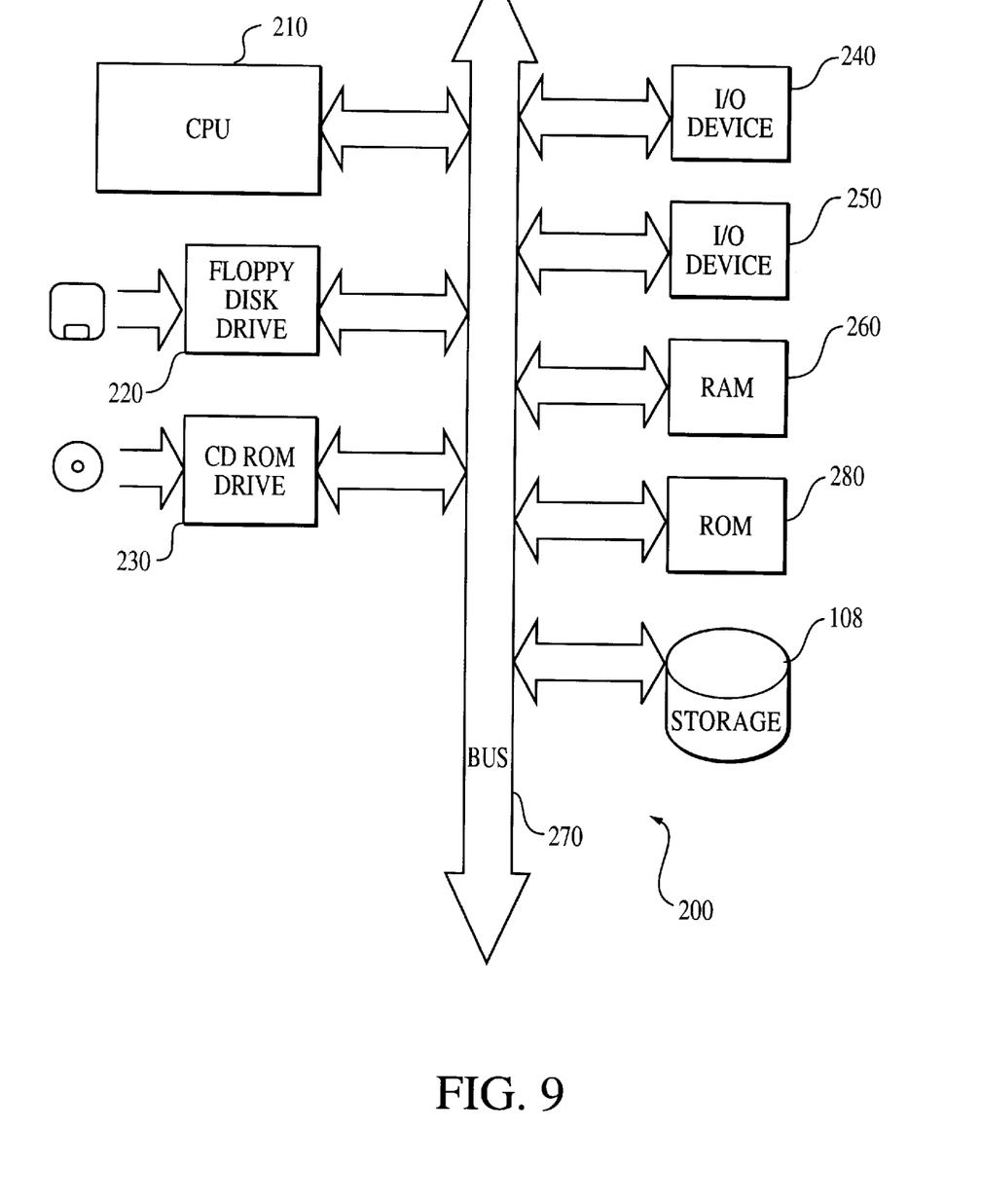
FIG. 9 illustrates a processor system which uses a memory subsystem which contains the invention.

A processor system which contains memory devices and a memory controller, which may be the processor itself, is illustrated in FIG. 9.

As shown in FIG. 9, a processor based system, such as a computer system, for example, generally has a central processing unit (CPU) 210, for example, a microprocessor, that communicates with one or more input/output (I/O) devices 240, 250 over a bus 270. The computer system 200 also includes random access memory (RAM) 260, a read only memory (ROM) 280 and, in the case of a computer system may include peripheral devices such as a floppy disk drive 220 and a compact disk (CD) ROM drive 230 which also communicate with CPU 210 over the bus 270. At least one of CPU 210 and one or more integrated circuits connected thereto over the bus, such as RAM 260 and ROM 280, may contain a DATA OUT waveform shaping circuit as described above with reference to FIGS. 6–8.

Although the invention has been described above in connection with exemplary embodiments, it is apparent that many modifications can be made without departing from the spirit or scope of the invention. Accordingly, the invention is not to be considered as limited by the foregoing description, but is only limited by the scope of the appended claims.

What is claimed as new and desired to be protected by Letters Patent of the United States is:

1. A memory circuit, comprising:
    at least one signal generator for generating at least one data signal on a data path of a memory bus, said signal generator comprising:
        a driver circuit for generating an output data signal on a data path; and
        a circuit for programmably altering a waveform shape of the output data signal generated by said driver circuit.
2. A memory circuit as in claim 1 wherein said programmably altering circuit programmably alters the slew rate of said output data signal.
3. A memory circuit as in claim 1 wherein said programmably altering circuit programmably alters the amplitude of at least a portion of the output data signal.
4. A memory circuit as in claim 1 wherein said programmably altering circuit programmably alters the slew rate and the amplitude of at least a portion of said output data signal.
5. A memory circuit as in claim 1 wherein said programmably altering circuit alters the shape of at least one of a rising and falling edge of said output data signal.
6. A memory circuit as in claim 1 wherein said driver circuit and said programmably altering circuit are provided at a controller for a memory bus system.
7. A memory circuit as in claim 1 wherein said driver circuit and said programmably altering circuit are provided at a memory storage device.
8. A memory circuit as in claim 1 wherein said driver circuit and said programmably altering circuit are provided on a memory module.
9. A memory circuit as in claim 8 wherein said driver circuit and a said programmably altering circuit are respectively provided at each of a plurality of memory storage devices on said memory module.
10. A memory circuit as in claim 8 wherein a said driver circuit is respectively provided at each of a plurality of memory storage devices on said memory module and said programmably altering circuit is provided on said memory module to commonly control the driver circuits of said memory storage devices.

11. A memory circuit as in claim 1, wherein said driver circuit comprises at least one paired pull-up and pull-down elements, at least one of which is controllable, said programmably altering circuit providing at least one control signal to said controllable element.

12. A memory circuit as in claim 1 wherein said driver circuit comprises at least one paired pull-up and pull-down driving elements and said programmably altering circuit provides control signals to said at least one paired pull-up and pull-down driving elements.

13. A memory circuit as in claim 1 wherein said driver circuit comprises a plurality of paired pull-up and pull-down driving elements, the outputs of said paired pull-up and pull-down driving elements being commonly connected to said data path, and said programmably altering circuit provides control signals to said paired pull-up and pull-down driving elements in accordance with applied program signals.

14. A memory circuit as in claim 13 wherein said programmably altering circuit comprises a plurality of programmable circuits each of which respectively controls paired pull-up and pull-down driving elements, each of said programmable circuits being responsive to respective program signals.

15. A memory circuit as in claim 14 wherein each of said programmable circuits is responsive to a first program signal to control whether a particular programmable circuit is operative to control a respective pair of pull-up-and pull-down elements.

16. A memory circuit as in claim 15 wherein each of said programmable circuits is responsive to at least one second program signal to control the drive strength of at least one of said pull up and pull down elements of a respective pair of pull-up and pull-down elements.

17. A memory circuit as in claim 16 wherein each of said programmable circuits is responsive to at least two second program signals to control the drive strength of said pull-up and pull-down elements of a respective pair of pull-up and pull-down elements.

18. A memory circuit as in claim 17 wherein each of said programmable circuits is responsive to a respective one of said second program signals to control the drive strength of a respective one of said pull-up and pull-down elements.

19. A memory circuit as in claim 1 further comprising a circuit responsive to programming signals for generating programming signal commands to said programmably altering circuit.

20. A memory circuit as in claim 19 wherein said programming signal command generating circuit comprises a register for receiving a digital programming command and a circuit portion for generating said programming signal commands based on said register contents.

21. A memory circuit as in claim 20 wherein said driver circuit comprises a plurality of first driver circuits having a common output on said data path, and said programmably altering circuit comprises a plurality of programmable circuits, each coupled to drive a respective first driver circuit, said circuit portion generating programming signal commands for said plurality of programmable circuits.

22. A memory circuit as in claim 21 wherein said circuit portion for generating programming signal commands generates respective programming signal commands for each of said plurality of programmable circuits.

23. A memory circuit as in claim 20 wherein said respective programming signal commands include a first programming signal which determines whether a respective programmable circuit is operative, and at least one second programming signal which causes said respective programmable circuit to determine a drive strength characteristic of a respective first driver circuit.

24. A memory circuit as in claim 23, wherein each said first driver circuit includes at least one pull-up element and at least one pull-down element, at least one of said pull-up and pull-down elements being controllable and said respective programming signal commands include commands to control the drive strength of said controllable element.

25. A memory circuit as in claim 23 wherein each said first driving circuit includes at least one pull-up element and at least one pull-down element and said respective programming signal commands include at least two second programming signals which respectively cause a programmable circuit to control the drive strength of said at least one pull-up and at least one pull-down element.

26. A memory circuit as in claim 23 wherein said circuit portion for generating programming signal commands controls at least the timing for said first programming signal.

27. A memory circuit as in claim 23 wherein said circuit portion for generating programming signal commands controls at least the pulse width of said first programming signal.

28. A memory circuit as in claim 23 wherein said circuit portion for generating programming signal commands controls the timing and pulse width of said first programming signal.

29. A memory circuit as in claim 20 wherein said register is provided on a memory module and said circuit portion is respectively provided on a plurality of memory storage devices resident on said module.

30. A memory circuit as in claim 20 wherein said register and circuit portion are provided on a memory module and the output of said circuit portion is commonly provided to a plurality of memory storage devices resident on said module, said respective memory storage devices containing said driver circuit and said programmably altering circuit.

31. A memory circuit as in claim 1 wherein said driver circuit comprises at least one pair of a pull-up and pull-down element, at least one of said pull-up and pull-down elements of the pairs being a first transistor and said programmably altering circuit includes at least one second transistor in series with said first transistor.

32. A memory circuit as in claim 1 wherein said driver circuit comprises at least one pair of a pull-up and pull-down transistor and said programmably altering circuit includes at least one transistor in series with said pull-up transistor and at least another additional transistor in series with said pull-down transistor.

33. A memory circuit as in claim 1, wherein said driver circuit comprises at least one paired pull-up and pull-down transistors, each of said transistors having a multiple finger gate, said programmably altering circuit providing control signals to said multiple finger gates of said pull-up and pull-down transistors.

34. A processor system comprising:
 a processor; and
 a memory system coupled to said processor through a bus system, at least one of said processor and memory system containing a data signal generator which comprises:
  a driver circuit for generating an output data signal on a data path; and a circuit for programmably altering a waveform shape of the output data signal generated by said driver circuit.

35. A system as in claim 34 wherein said programmably altering circuit programmably alters the slew rate of said output data signal.

36. A system as in claim 34 wherein said programmably altering circuit programmably alters the amplitude of at least a portion of the output data signal.

37. A system as in claim 34 wherein said programmably altering circuit programmably alters the slew rate and the amplitude of at least a portion of said output data signal.

38. A system as in claim 34 wherein said programmably altering circuit alters the shape of at least one of a rising and falling edge of said output data signal.

39. A system as in claim 34 wherein said driver circuit and said programmably altering circuit are provided at a controller for said bus system.

40. A system as in claim 34 wherein said driver circuit and said programmably altering circuit are provided at a memory storage device coupled to said bus system.

41. A system as in claim 34 wherein said driver circuit and said programmably altering circuit are provided on a memory module of said memory system.

42. A system as in claim 41 wherein said driver circuit and a said programmably altering circuit are respectively provided at each of a plurality of memory storage devices on said memory module.

43. A system as in claim 41 wherein a said driver circuit is respectively provided at each of a plurality of memory storage devices on said memory module and said programmably altering circuit is provided on said memory module to commonly control the driver circuits of said memory storage devices.

44. A system as in claim 34 wherein said driver circuit comprises at least one paired pull-up and pull-down elements, at least one of which is controllable, said programmably altering circuit providing at least one control signal to said controllable element.

45. A system as in claim 34 wherein said driver circuit comprises at least one paired pull-up and pull-down driving elements and said programmably altering circuit provides control signals to said at least one paired pull-up and pull-down driving elements.

46. A system as in claim 34 wherein said driver circuit comprises a plurality of paired pull-up and pull-down driving elements, the outputs of said paired pull-up and pull-down driving elements being commonly connected to said data path, and said programmably altering circuit provides control signals to said paired pull-up and pull-down driving elements in accordance with applied program signals.

47. A system as in claim 46 wherein said programmably altering circuit comprises a plurality of programmable circuits each of which respectively controls paired pull-up and pull-down driving elements, each of said programmable circuits being responsive to respective program signals.

48. A system as in claim 47 wherein each of said programmable circuits is responsive to a first program signal to control whether a particular programmable circuit is operative to control a respective pair of pull-up-and pull-down elements.

49. A system as in claim 48 wherein each of said programmable circuits is responsive to at least one second program signal to control the drive strength of at least one of said pull up and pull down elements of a respective pair of pull-up and pull-down elements.

50. A system as in claim 49 wherein each of said programmable circuits is responsive to at least two second program signals to control the drive strength of said pull-up and pull-down elements of a respective pair of pull-up and pull-down elements.

51. A system as in claim 50 wherein each of said programmable circuits is responsive to a respective one of said second program signals to control the drive strength of a respective one of said pull-up and pull-down elements.

52. A system as in claim 34 further comprising a circuit responsive to programming signals for generating programming signal commands to said programmably altering circuit.

53. A system as in claim 52 wherein said programming signal command generating circuit comprises a register for receiving a digital programming command and a circuit portion for generating said programming signal commands based on said register contents.

54. A system as in claim 53 wherein said driver circuit comprises a plurality of first driver circuits having a common output on said data path, and said programmably altering circuit comprises a plurality of signal programmable circuits, each coupled to drive a respective first driver circuit, said circuit portion generating programming signal commands for said plurality of programmable circuits.

55. A system as in claim 54 wherein said circuit portion for generating programming signal commands generates respective programming signal commands for each of said plurality of programmable circuits.

56. A system as in claim 53 wherein said respective programming signal commands include a first programming signal which determines whether a respective programmable circuit is operative, and at least one second programming signal which causes said respective programmable circuit to determine a drive strength characteristic of a respective first driver circuit.

57. A system as in claim 56, wherein each said first driving circuit includes at least one pull-up element and at least one pull-down element, at least one of said pull-up and pull-down elements being controllable and said respective programming signal commands include commands to control the drive strength of said controllable element.

58. A system as in claim 56 wherein each said first driver circuit includes at least one pull-up element and at least one pull-down element and said respective programming signal commands include at least two second programming signals which respectively cause a programmable circuit control the drive strength of said at least one pull-up and at least one pull-down element.

59. A system as in claim 56 wherein said circuit portion for generating programming signal commands controls at least the timing for said first programming signal.

60. A system as in claim 56 wherein said circuit portion for generating programming signal commands controls at least the pulse width of said first programming signal.

61. A system as in claim 56 wherein said circuit portion for generating programming signal commands controls the timing and pulse width of said first programming signal.

62. A system as in claim 53 wherein said register is provided on a memory module of said memory system and said circuit portion is respectively provided on a plurality of memory storage devices resident on said module of said memory system.

63. A system as in claim 53 wherein said register and circuit portion are provided on a memory module of said memory system and the output of said circuit portion is commonly provided to a plurality of memory storage devices resident on said module of said memory system, said respective memory storage devices containing said driver circuit and said programmably altering circuit.

64. A system as in claim 34 wherein said driver circuit comprises at least one pair of a pull-up and pull-down element, at least one of said pull-up and pull-down elements of the pairs being a first transistor and said programmably altering circuit includes at least one second transistor in series with said first transistor.

65. A system as in claim 34 wherein said driver circuit comprises at least one pair of a pull-up and pull-down transistor and said programmably altering circuit includes at least one transistor in series with said pull-up transistor and at least another additional transistor in series with said pull-down transistor.

66. A system as in claim 34 wherein said data signal generator is provided in said processor.

67. A system as in claim 34, wherein said driver circuit comprises at least one paired pull-up and pull-down transistors, each of said transistors having a multiple finger gate, said programmably altering circuit providing control signals to said multiple finger gates of said pull-up and pull-down transistors.

68. A memory system comprising:
 a bus system;
 a memory controller coupled to said bus system; and
 at least one memory module coupled to said bus system, each said memory module containing at least one memory storage device;
 at least one of said memory controller and said memory module containing at least one signal generator for generating at least one data signal on a data path of said bus, said data signal generator comprising:
  a driver circuit for generating an output data signal on a data path; and
  a circuit for programmably altering a waveform shape of the output data signal generated by said driver circuit.

69. A memory system as in claim 68 wherein said programmably altering circuit programmably alters the slew rate of said output data signal.

70. A memory system as in claim 68 wherein said programmably altering circuit programmably alters the amplitude of at least a portion of the output data signal.

71. A memory system as in claim 68 wherein said programmably altering circuit programmably alters the slew rate and the amplitude of at least a portion of said output data signal.

72. A memory system as in claim 68 wherein said programmably altering circuit alters the shape of at least one of a rising and falling edge of said output data signal.

73. A memory system as in claim 68 wherein said driver circuit and said programmably altering circuit are provided at said controller for said memory bus system.

74. A memory system as in claim 68 wherein said driver circuit and said programmably altering circuit are provided at a memory storage device of said memory system.

75. A memory system as in claim 68 wherein said driver circuit and said programmably altering circuit are provided on a memory module of said memory system.

76. A memory system as in claim 75 wherein said driver circuit and a said programmably altering circuit are respectively provided at each of a plurality of memory storage devices on said memory module.

77. A memory system as in claim 75 wherein a said driver circuit is respectively provided at each of a plurality of memory storage devices on said memory module and said programmably altering circuit is provided on said memory module to commonly control the driver circuits of said memory storage devices.

78. A memory system as in claim 68, wherein said driver circuit comprises at least one paired pull-up and pull-down elements, at least one of which is controllable, said programmably altering circuit providing at least one control signal to said controllable element.

79. A memory system as in claim 68 wherein said driver circuit comprises at least one paired pull-up and pull-down driving elements and said programmably altering circuit provides control signals to said at least one paired pull-up and pull-down driving elements.

80. A memory system as in claim 68 wherein said driver circuit comprises a plurality of paired pull-up and pull-down driving elements, the outputs of said paired pull-up and pull-down driving elements being commonly connected to said data path, and said programmably altering circuit provides control signals to said paired pull-up and pull-down driving elements in accordance with applied program signals.

81. A memory system as in claim 80 wherein said programmably altering circuit comprises a plurality of programmable circuits each of which respectively controls paired pull-up and pull-down driving elements, each of said programmable circuits being responsive to respective program signals.

82. A memory system as in claim 81 wherein each of said programmable circuits is responsive to a first program signal to control whether a particular programmable circuit is operative to control a respective pair of pull-up-and pull-down elements.

83. A memory system as in claim 82 wherein each of said programmable circuits is responsive to at least one second program signal to control the drive strength of at least one of said pull up and pull down elements of a respective pair of pull-up and pull-down elements.

84. A memory system as in claim 83 wherein each of said programmable circuits is responsive to at least two second program signals to control the drive strength of said pull-up and pull-down elements of a respective pair of pull-up and pull-down elements.

85. A memory system as in claim 84 wherein each of said programmable circuits is responsive to a respective one of said second program signals to control the drive strength of a respective one of said pull-up and pull-down elements.

86. A memory system as in claim 68 further comprising a circuit responsive for programming signals for generating programming signal commands to said programmably altering circuit.

87. A memory system as in claim 86 wherein said programming signal command generating circuit comprises a register for receiving a digital programming command and a circuit portion for generating said programming signal commands based on said register contents.

88. A memory system as in claim 87 wherein said driver circuit comprises a plurality of first driver circuits having a common output on said data path, and said programmably altering circuit comprises a plurality of programmable circuits, each coupled to drive a respective first driver circuit, said circuit portion generating programming signal commands for said plurality of programmable circuits.

89. A memory system as in claim 88 wherein said circuit portion for generating programming signal commands generates respective programming signal commands for each of said plurality of programmable circuits.

90. A memory system as in claim 87 wherein said respective programming signal commands include a first programming signal which determines whether a respective programmable circuit is operative, and at least one second programming signal which causes said respective programmable circuit to determine a drive strength characteristic of a respective first driver circuit.

91. A memory system as in claim 90, wherein each said first driver circuit includes at least one pull-up element and at least one pull-down element, at least one of said pull-up and pull-down elements being controllable and said respective programming signal commands include commands to control the drive strength of said controllable element.

92. A memory system as in claim 90 wherein each said first driving circuit includes at least one pull-up element and at least one pull-down element and said respective programming signal commands include at least two second programming signals which respectively cause a programmable circuit to control the drive strength of said at least one pull-up and at least one pull-down element.

93. A memory system as in claim 90 wherein said circuit portion for generating programming signal commands controls at least the timing for said first programming signal.

94. A memory system as in claim 90 wherein said circuit portion for generating programming signal commands controls at least the pulse width of said first programming signal.

95. A memory system as in claim 90 wherein said circuit portion for generating programming signal commands controls the timing and pulse width of said first programming signal.

96. A memory system as in claim 87 wherein said register is provided on a memory module of said memory system and said circuit portion is respectively provided on a plurality of memory storage devices resident on said module.

97. A memory system as in claim 87 wherein said register and circuit portion are provided on a memory module of said memory system and the output of said circuit portion is commonly provided to a plurality of memory storage devices resident on said module, said respective memory storage devices containing said driver circuit and said programmably altering circuit.

98. A memory system as in claim 68 wherein said driver circuit comprises at least one pair of a pull-up and pull-down element, at least one of said pull-up and pull-down elements of the pairs being a first transistor and said programmably altering circuit includes at least one second transistor in series with said first transistor.

99. A memory system as in claim 68 wherein said driver circuit comprises at least one pair of a pull-up and pull-down transistor and said programmably altering circuit includes at least one transistor in series with said pull-up transistor and at least another additional transistor in series with said pull-down transistor.

100. A memory system as in claim 68, wherein said driver circuit comprises at least one paired pull-up and pull-down transistors, each of said transistors having a multiple finger gate, said programmably altering circuit providing control signals to said multiple finger gates of said pull-up and pull-down transistors.

101. A method of generating a data signal on a data path of a bus, said method comprising:

generating a data signal on said data path; and altering the waveform characteristics of at least a portion of said data signal in accordance with at least one applied program signal.

102. A method as in claim 101 wherein a slew rate of said data signal is altered in accordance with at least one applied program signal.

103. A method as in claim 101 wherein at least the amplitude of at least a portion of said data signal is altered in accordance with at least one applied program signal.

104. A method as in claim 101 wherein a shape of at least one of a rising and falling edge of said data signal is altered in accordance with at least one applied program signal.

105. A method as in claim 101 wherein both the slew rate and amplitude of at least a portion of said data signal is altered in accordance with at least one applied program.

106. A method as in claim 101 wherein said method occurs at a controller of a memory bus system.

107. A method as in claim 101 wherein said method occurs at a memory module of a memory bus system.

108. A method as in claim 107 wherein said method occurs at a memory storage device of said memory module.

109. A method of generating a data signal on a data path of a bus, said method comprising:

determining how a data signal applied to a bus is degraded when traveling from a first generating device to a second receiving device coupled to said bus; and programmably altering a waveform shape of said data signal at said first generating device to reduce the degradation of said data signal as received at said second receiving device.

110. A method as in claim 109 further comprising programmably altering at least the slew rate of a portion of said data signal.

111. A method as in claim 109 further comprising programmably altering at least the amplitude of a portion of said data signal.

112. A method as in claim 109 further comprising programmably altering the shape of at least one of a rising and falling edge of said data signal.

113. A method as in claim 109 further comprising programmably altering both the slew rate and amplitude of at least a portion of said data signal.

* * * * *

UNITED STATES PATENT AND TRADEMARK OFFICE
CERTIFICATE OF CORRECTION

PATENT NO. : 6,256,235 B1
DATED : July 3, 2001
INVENTOR(S) : Terry R. Lee

It is certified that error appears in the above-identified patent and that said Letters Patent is hereby corrected as shown below:

<u>Column 6,</u>
Line 43, the phrase "spirit o" should be replaced with the phrase -- spirit or --.

<u>Claim 58,</u>
Line 5, the phrase "circuit control" should be replaced with the phrase -- circuit to control --.

Signed and Sealed this

Twenty-ninth Day of January, 2002

Attest:

Attesting Officer

JAMES E. ROGAN
*Director of the United States Patent and Trademark Office*